United States Patent
Geurink et al.

(10) Patent No.: US 12,431,320 B2
(45) Date of Patent: Sep. 30, 2025

(54) MODULAR ULTRA-HIGH VACUUM ELECTRON MICROSCOPE

(71) Applicant: FEI Company, Hillsboro, OR (US)

(72) Inventors: Rudolf Geurink, Eindhoven (NL); Hugo Cornelis Van Leeuwen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 397 days.

(21) Appl. No.: 17/958,070

(22) Filed: Sep. 30, 2022

(65) Prior Publication Data

US 2023/0101644 A1    Mar. 30, 2023

Related U.S. Application Data

(60) Provisional application No. 63/250,771, filed on Sep. 30, 2021.

(51) Int. Cl.
*H01J 37/18*    (2006.01)
*H01J 37/147*    (2006.01)

(52) U.S. Cl.
CPC .......... *H01J 37/185* (2013.01); *H01J 37/147* (2013.01)

(58) Field of Classification Search
CPC .. H01J 37/185; H01J 37/147; H01J 2237/182; H01J 2237/184; H01J 2237/186; H01J 2237/206; H01J 2237/208; H01J 37/18
See application file for complete search history.

(56) References Cited

U.S. PATENT DOCUMENTS 6,242,737 B1    6/2001 Ohnishi et al.
2008/0014056 A1    1/2008 Miller

FOREIGN PATENT DOCUMENTS

EP    0899561 B1    12/2007
JP    H04 286843 A    10/1992
JP    2014089936 A    5/2014

OTHER PUBLICATIONS

Extended European Search Report issued in corresponding EP Application No. 22199033.6 on Mar. 3, 2023 (9 pages).

*Primary Examiner* — David E Smith
*Assistant Examiner* — Christopher J Gassen
(74) *Attorney, Agent, or Firm* — Kilpatrick Townsend & Stockton LLP (57) ABSTRACT

A modular ultra-high vacuum (UHV) electron microscope for investigating a sample, according to the present disclosure includes a UHV chamber configured to reach and maintain an ultra-high vacuum within the UHV chamber, a UHV stage to hold the sample being investigated, a charged particle source configured to emit an electron beam toward the sample, and an optical column configured to direct the plurality of electrons to be incident on the sample. The modular UHV electron microscopes further include a carousel vacuum bay configured to reach and maintain an UHV independently of the UHV chamber, and which is connected to the UHV chamber via a port and contains at least one device manipulator. Each of the device manipulators comprise an attachment site for a microscope device, and are configured to, selectively translate attached microscope devices between the carousel vacuum bay and the UHV chamber via the valve.

20 Claims, 4 Drawing Sheets

MODULAR ULTRA-HIGH VACUUM ELECTRON MICROSCOPE

This application claims priority from U.S. Provisional Application No. 63/250,771 filed Sep. 30, 2021 which is hereby incorporated by reference.

BACKGROUND OF THE INVENTION

As scientists increasingly look to investigate the atomic characteristics of our world, electron microscope technology must be continually refined to achieve the greatest degree of imaging resolution. To achieve such a high resolution, some electron microscopes utilize vacuum chambers that can achieve and maintain a state of ultra-high vacuum within which a sample can be investigated. While an ultra-high vacuum allows for electron beam imaging to occur with minimal interference from loose particles in the chamber, achieving an ultra-high vacuum within the chamber of a microscope is a multi-week process during which the microscope cannot be used. Additionally, the process for achieving ultra-high vacuum involves baking the chamber and pumping gas out of the chamber. This baking process produces further downtime as the microscope's heating causes the optical components of the microscope to move, requiring the optical column of the microscope to be realigned. Because of this, once a chamber of an electron microscope achieves a state of ultra-high vacuum, it is important to minimize the occasions when the vacuum must be broken.

Another issue faced in UHV electron microscopes is the limited amount of space within the vacuum chamber. In addition to the chambers defining a small volume for microscope devices (i.e., detectors of various nature (e.g. Secondary Electrons, Cathode Luminescence, etc.), stimulators of various nature (e.g. magnetic stimuli, laser light stimuli, high frequent electromagnetic stimuli, etc.), mirrors, deposition systems, gas inlets, sample manipulators, etc.), there is a limited number of ports through which the microscope devices can be inserted into the chamber. This becomes an especially limiting problem with UHV electron microscopes, as swapping out or adjusting microscope devices in the microscope involves breaking the ultra-high vacuum in the chamber. Thus, if a user wants to switch the type of experiments/investigations that a current UHV electron microscope is configured to run, this process involves weeks or months of system downtime before the UHV electron microscope is ready to operate in its new configuration. Because of these concerns, it is desired to have a UHV electron microscope system that can switch its configurations to run different experiments/investigations without needing to break the UHV in the chamber.

SUMMARY

A modular ultra-high vacuum (UHV) electron microscope for investigating a sample, according to the present disclosure, includes a UHV chamber configured to reach and maintain an ultra-high vacuum within the UHV chamber, a UHV stage configured to hold the sample being investigated, a charged particle source configured to emit a plurality of electrons toward the sample, and an optical column configured to direct the plurality of electrons to be incident on the sample. The modular UHV electron microscopes further include a carousel vacuum bay configured to reach and maintain an ultra-high vacuum independently of the UHV chamber. The carousel vacuum bay is connected to the UHV chamber via a port and contains at least one device manipulator. Each of the device manipulators comprise an attachment site for a microscope device, and are configured to, when a microscope device is attached to its corresponding attachment site, selectively translate the attached microscope device between the carousel vacuum bay and the UHV chamber via the valve. According to the present disclosure the port may have a valve configured to selectively switch between operating in an open state and operating in a closed state open. The carousel vacuum bay is open to the UHV chamber when the valve is operating in the open state, and the valve seals the carousel vacuum bay from the UHV chamber when the valve is operating in the closed state. In this way, when the valve is operating in the closed state, the vacuum in the carousel vacuum chamber can be broken without breaking the ultra-high vacuum in the UHV chamber.

Methods for using a modular UHV electron microscope for investigating a sample, according to the present disclosure include the steps of translating a first microscope device between a UHV chamber and a carousel vacuum chamber via a port, and translating a second microscope device between the carousel vacuum chamber and the UHV chamber via the port. According to the methods, the UHV is maintained in the UHV chamber while the first microscope device is translated, and second microscope device is translated. In this way, a user can conduct different types of investigations of a sample by introducing a plurality of different microscope devices into the UHV chamber via a single port.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Modular ultra-high vacuum (UHV) electron microscopes for investigating a sample and methods for using them, are disclosed herein. More specifically, the systems according to the present disclosure a carousel vacuum bay that is configured to store a plurality of different microscope devices (i.e., detectors, stimulators, mirrors, deposition systems, sample manipulators, etc.) that can be selectively translated between the carousel vacuum bay and the microscopes UHV chamber via a single port. In some embodiments, different combinations of microscope devices can be selectively translated from the carousel vacuum bay and desired positions within the UHV chamber to allow for different experiments/investigations to be conducted by the modular UHV electron microscope without needing to break the state of ultra-high vacuum in the UHV chamber. In some embodiments, more than one microscope device can be simultaneously translated from the carousel vacuum bay and desired positions within the UHV chamber via the port.

Additionally, the carousel vacuum bay is connected to the UHV chamber via a port having a valve that can selectively seal the carousel vacuum bay from the UHV chamber. In this way, when the valve is closed, the state of ultra-high vacuum in the carousel vacuum bay can be broken without breaking the ultra-high vacuum in the UHV chamber. Additionally, because the carousel vacuum bay is able to be independently brought to UHV, a user can conduct experiments/investigations of a sample during the time that the carousel vacuum bay is opened to the environment (e.g., to allow individual microscope devices to be changed and/or adjusted). This drastically reduces the amount of system downtime for users desiring to conduct a variety of types of experiments/investigations using modular UHV electron microscopes of the present disclosure.

Figure 1:
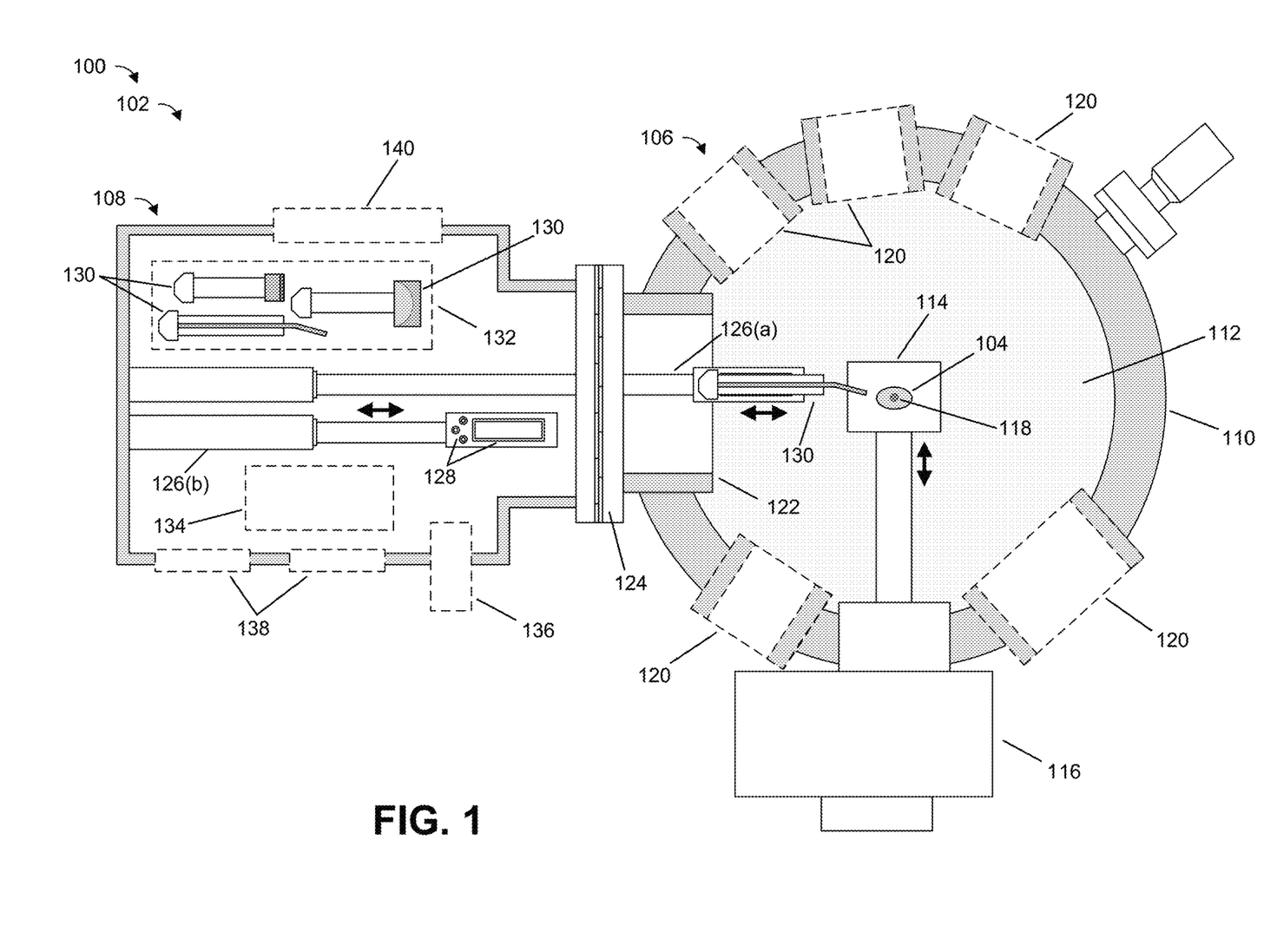
FIG. 1 illustrates a cross section of example modular ultra-high vacuum (UHV) electron microscopes for investigating a sample.

FIG. 1 is an illustration of cross section 100 of example modular ultra-high vacuum (UHV) electron microscopes 102 for investigating a sample. The example modular ultra-high vacuum (UHV) electron microscopes 102 may be or include one or more different types of optical, and/or charged particle microscopes, such as, but not limited to, a scanning transmission electron microscope (STEM), a transmission electron microscope (TEM), a charged particle microscope (CPM), a cryo-compatible microscope, focused ion beam microscope (FIBs), dual beam microscopy system, or combinations thereof.

The modular ultra-high vacuum (UHV) electron microscopes 102 include a UHV chamber 106 configured to obtain and maintain an ultra-high vacuum, and a carousel vacuum chamber 108 configured to independently obtain and maintain an ultra-high vacuum. In the present disclosure, an ultra-high vacuum is defined as $<5*10^{-10}$ mbar. The UHV chamber 106 is shown as comprising a body 110 that defines an interior volume 112 of the UHV chamber 106.

The UHV chamber 106 is shown as including a sample holder 114 that is configured to hold the sample 104 during investigation. The sample holder 114 is further able to translate the sample 104 within the UHV chamber 106. For example, the sample 104 may be attached to the sample holder 114 in a sample bay 116, and then the sample holder 114 may be extended into the interior volume 112 so that the sample is positioned to be irradiated by an electron beam 118 during use of the example modular ultra-high vacuum (UHV) electron microscopes 102 to investigate the sample.

While not depicted in FIG. 1, a person having skill in the art would understand that the UHV chamber 106 would further include one or more pumps and/or elements configured to allow the interior volume 112 of the UHV chamber 106 to obtain and maintain a state of ultra-high vacuum. For example, the UHV chamber 106 may include one or more elements that allow the UHV chamber 106 to be baked to reduce the gasses released by the body 110, and one or more pumps that remove gas from the interior volume 112 until a state of ultra-high vacuum is achieved.

FIG. 1 also shows a plurality of optional ports 120 defined in the body 110, which each allow individual microscope systems to have access to the interior volume 112. However, as there is a limit to the number of optional ports 120 that can be defined by the body 110, and because there is a limited amount of space in the interior volume 112, there has traditionally been a limit to the number of microscope devices and/or systems that can be given access to the interior volume 112 during use of current electron microscopes.

The example modular ultra-high vacuum (UHV) electron microscopes 102 of the present disclosure overcome this limitation through the presence of the carousel vacuum bay 108 that is connected to the UHV chamber 106 via a port 122, and which is configured to reach and maintain an ultra-high vacuum independently of the UHV chamber 106. The port 112 may define an aperture having a diameter of at least one of 30 mm, 60 mm, 90 mm, 120 mm. According to the present disclosure, the port 122 may have a valve 124 configured to selectively switch between operating in an open state and operating in a closed state open. When the valve 124 is operating in the open state, the carousel vacuum bay 108 is open to the UHV chamber 106, and the valve 124 seals the carousel vacuum bay 106 from the UHV chamber 106 when the valve 124 is operating in the closed state. In this way, when the valve 124 is operating in the closed state, the vacuum in the carousel vacuum chamber 108 can be broken without breaking the ultra-high vacuum in the UHV chamber 106. Thus, when the valve 124 is operating in a closed state, the vacuum in the carousel vacuum chamber 108 can be broken while still allowing a user to investigate a sample 104 in the UHV chamber 106.

The carousel vacuum bay 108 is further shown as containing at least one device manipulator 126. Each of the device manipulators 126 comprise an attachment site 128 for a microscope device 130. When a microscope device 130 is attached to its corresponding attachment site 128, the corresponding device manipulator 126 may selectively translate the attached microscope device 130 between the carousel vacuum bay 108 and the UHV chamber 106 via the port 122. For example, the device manipulator may extend at least partly through the port 122 and into the UHV chamber 106 so that an attached microscope device 130 is positioned at a desired location in relation to the sample 104. The desired position may be determined based on a type of microscope device 130 attached to the corresponding device manipulator, a user selection, a sample type, microscope settings, an experiment type, or a combination thereof.

FIG. 1 shows the carousel vacuum bay 108 as including two device manipulators 126(*a*) and 126(*b*), but a person having skill in the art would understand that additional device manipulators may be stored in the carousel vacuum bay 108. While FIG. 1 illustrates only one device manipulator 126(*a*) as being extended into the UHV chamber 106, in some embodiments a plurality of device manipulators 126 may each translate corresponding microscope devices 130 into UH vacuum chamber 106 at the same time. In modular UHV electron microscopes 102 where the carousel vacuum chamber 108 contains more device manipulators 126 than can be simultaneously translated through the port 122 into the UHV chamber 106, the device manipulators 126 may be configured to be translated within the carousel vacuum chamber 106 to allow different combinations of device manipulators 126 to move the microscope devices 130 attached to them into the UH vacuum chamber 106 via the port 122. For example, a plurality of device manipulators 126 may be attached to a structure that can be rotated and/or moved such that different device manipulators 126 are able to extend through the port 122.

An attachment site 128 may comprise at least one of a mechanical connector, a data connection, an electrical connection, and a gas connection. For example, an attachment site may include a gas connection to allow a gas injection tool connected to the device manipulator is able to deliver a gas species at or near the sample, and an electrical connection to allow the rate of delivery of the gas to be controlled. In another example, a detector may connect to a data connection to allow information captured by a detector attached to the device manipulator to transmit collected information to a computing device associated with the modular UHV electron microscope.

According to the present disclosure, the microscope devices 130 can be selectively attached and detached from attachment sites 128 of the device manipulators 126 without damage to the microscope device, the device manipulator, and/or the attachment site. FIG. 1 shows the carousel vacuum bay 108 as including a plurality of additional microscope devices 130. When not attached to a device manipulator 126, additional microscope device 130 can be attached to one or more storage attachment sites 132, wherein individual microscope devices 130 can be selectively attached and detached to individual storage attachment sites 132 within the carousel vacuum bay 108. That is, the individual microscope devices 130 can be selectively attached and detached to the storage attachment sites 132 without damage to the microscope device, and/or the attachment site. In this way, the carousel vacuum bay 108 can house more microscope devices 130 than can simultaneously attached to the attachment sites 128 on the device manipulators 126. This allows for extra microscope devices 132 to be stowed within the carousel vacuum bay 108 when not in use. The ability to store a wide array of microscope devices 130 that can be selectively attached to an attachment site 128 of a microscope device 126 greatly expands the types of experiments and/or investigations that the modular UHV electron microscope 102 can be used for without breaking the vacuums in the UHV chamber 106 or the carousel vacuum bay 108. The carousel vacuum bay 108 may further include an optional loading mechanism 134 that is configured to transition individual microscope devices 130 between attachment to a corresponding attachment site 128 and attachment to a corresponding storage attachment As discussed above, the vacuum chamber 108 is configured to be baked to reduce gas load from the bulk material, and then reduce the pressure via pumping separately from the UHV chamber 106. That is, the vacuum chamber 108 includes one or more pumps and/or elements 136 configured to allow the interior volume of the carousel vacuum chamber 108 to obtain and maintain a state of ultra-high vacuum. Because the one or more pumps and/or elements 136 are able to bring the interior of the carousel vacuum chamber 108 to a state of UHV without breaking the UHV in the UHV chamber 106 or causing a misalignment of the optics of the modular UHV electron microscope 102.

In some embodiments, the carousel vacuum bay 108 may further optionally include at least one door and/or port 138 that are able to be selectively opened to allow access to the interior of the carousel vacuum bay 108. For example, individual doors and/or ports 138 may be opened so that one or more additional microscope devices 130 can be added to the carousel vacuum bay, individual device manipulators 126 or microscope devices 130 can be adjusted, or a combination thereof. Alternatively, or in addition, the carousel vacuum bay 108 may further optionally include a UHV loader 140 configured to receive a UHV compartment from the environment and introduce the UHV compartment to the interior of the carousel vacuum chamber 108 without breaking the vacuum in the carousel vacuum chamber. For example, a UHV compartment may define an inner volume at a state of UHV that contains a payload that is to be introduced into the carousel vacuum chamber 108 from the environment without breaking the state of UHV within the carousel vacuum chamber 108. In embodiments where the modular UHV electron microscope 102 has a UHV loader 140 and a loading mechanism 134, the loading mechanism 134 may be further configured to remove a new microscope device 130 from a UHV compartment and attach the new microscope device 130 to a corresponding attachment site 128 or storage site 132.

Figure 2:
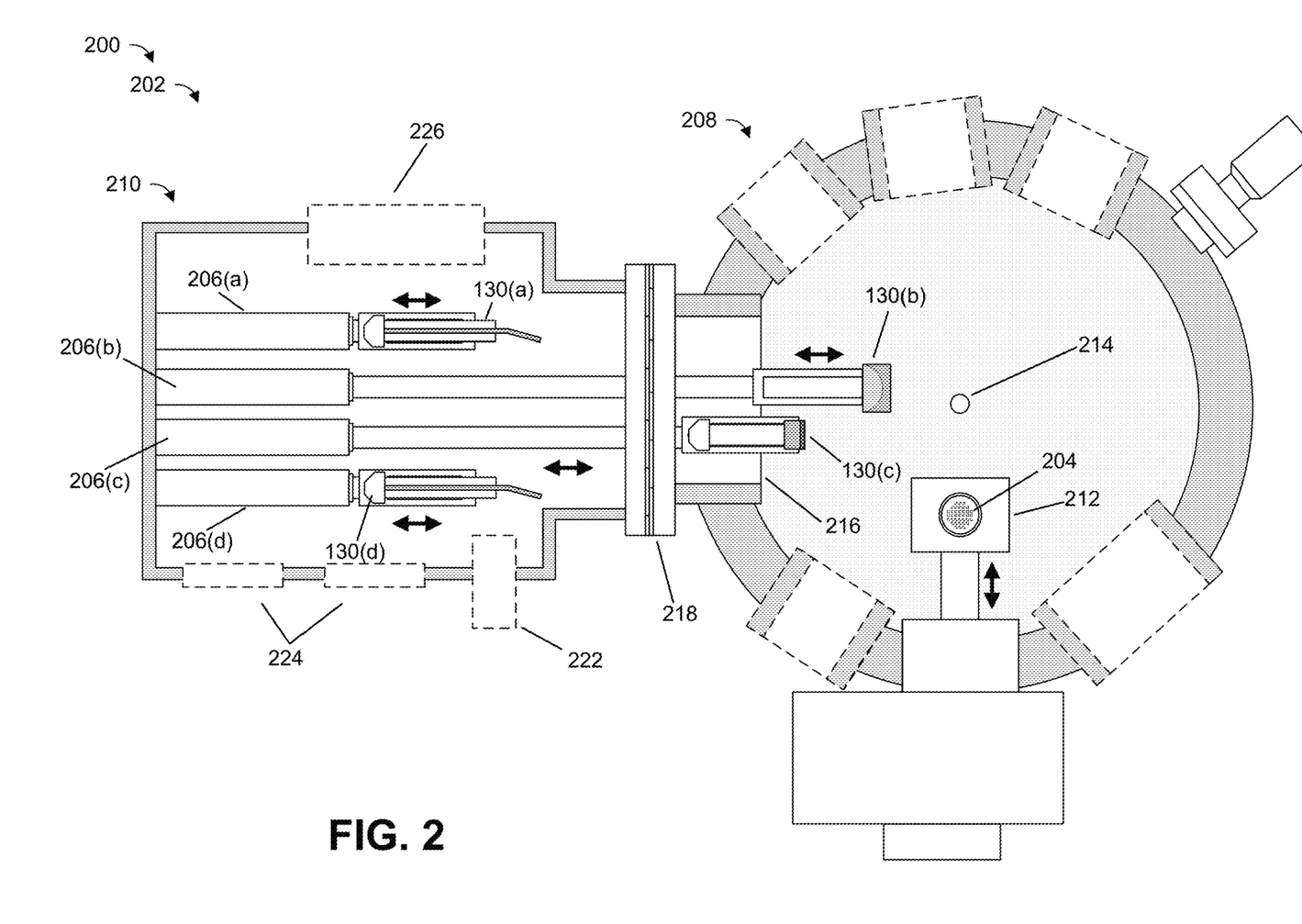
FIG. 2 illustrates a cross section of example modular UHV electron microscopes for investigating a sample with a plurality of translatable device manipulators.

FIG. 2 is an illustration of cross section 200 of example modular ultra-high vacuum (UHV) electron microscopes 202 for investigating a sample 204 with a plurality of translatable device manipulators 206(a)-(d). The example modular ultra-high vacuum (UHV) electron microscopes 202 may be or include one or more different types of optical, and/or charged particle microscopes, such as, but not limited to, a scanning transmission electron microscope (STEM), a transmission electron microscope (TEM), a charged particle microscope (CPM), a cryo-compatible microscope, focused ion beam microscope (FIBs), dual beam microscopy system, or combinations thereof. The modular ultra-high vacuum (UHV) electron microscopes 202 include a UHV chamber 208 configured to obtain and maintain an ultra-high vacuum, and a carousel vacuum chamber 210 configured to independently obtain and maintain an ultra-high vacuum.

The UHV chamber 208 is shown as including a sample holder 212 that is configured to hold the sample 204 during investigation. The sample holder 212 is further able to translate the sample 204 within the UHV chamber 208. For example, the sample holder 212 may be configured to translate the sample 204 from a sample bay to a location within the UHV chamber 208 where the sample 204 can be irradiated by an electron beam 214. A person having skill in the art would understand that the UHV chamber 208 would further include one or more pumps and/or elements configured to allow the UHV chamber 208 to obtain and maintain a state of ultra-high vacuum.

FIG. 2 also shows the carousel vacuum bay 210 as being connected to the UHV chamber 208 via a port 216, and which is configured to reach and maintain an ultra-high vacuum independently of the UHV chamber 208. The port 216 may have a valve 218 configured to selectively switch between operating in an open state and operating in a closed state open. When the valve 218 is operating in the open state, the carousel vacuum bay 210 is open to the UHV chamber 208, and the valve 218 seals the carousel vacuum bay 210 from the UHV chamber 208 when the valve 218 is operating in the closed state.

The carousel vacuum bay 210 is shown FIG. 2 as containing four device manipulators 206(a)-(d). Each of the device manipulators 206 comprise an attachment site for a microscope device 220(a)-(d). When a microscope device 220 is attached to its corresponding attachment site, the corresponding device manipulator 206 may selectively translate the attached microscope device 220 between the carousel vacuum bay 210 and the UHV chamber 208 via the port 216. For example, FIG. 2 shows an embodiment where both the device manipulator 206(b) and device manipulator 206(c) are simultaneously translating microscope devices 220(b) and 220(c), respectively, into the UHV camber 208. The desired position to which a microscope device 220 is translated may be determined based on a type of microscope device 220 attached to the corresponding device manipulator, a user selection, a sample type, microscope settings, an experiment type, or a combination thereof. For example, FIG. 2 shows microscope device 220(b) as being a mirror device that can be positioned to reflect emissions generated by irradiation of the sample 204 with the electron beam 214 towards a detector system (e.g., microscope device 220(c)).

FIG. 2 shows the carousel vacuum chamber 210 of UHV electron microscopes 202 as containing more device manipulators 206 than can be simultaneously translated through the port 216 into the UHV chamber 208. In such an embodiments, the device manipulators 206(a)-(d) are configured to be translated within the carousel vacuum chamber 210 to allow different combinations of device manipulators 206 to translate their corresponding microscope devices 220 into the UH vacuum chamber 208. For example, individual of device manipulators 206 may be translatable within the carousel vacuum chamber 210, such that device manipulator 206(b) may be retracted and then moved away from a position where it can extend through the port 216, and device manipulator 206(a) can be moved to a position where it can extend through the port 216. Alternatively, each of the device manipulators 206(a)-(d) may be attached to a structure that can be rotated and/or moved such that different device manipulators 206 are able to extend through the port 216 at different rotations/positions of the structure.

According to the present disclosure, the microscope devices 220 can be selectively attached and detached from attachment sites of the device manipulators 206 without damage to the microscope device, the device manipulator, and/or the attachment site. While not shown in FIG. 2, in some embodiments the carousel vacuum bay 210 may including a plurality of additional microscope devices attached to one or more storage attachment sites. In such embodiments, the individual microscope devices 220 be selectively attached and detached to individual storage attachment sites within the carousel vacuum bay 210.

As discussed above, the vacuum chamber 210 is configured to be baked to reduce the gas load from the bulk material, and then reduce the pressure via pumping separately from the UHV chamber 208. That is, the vacuum chamber 210 includes one or more pumps and/or elements 222 configured to allow the interior volume of the carousel vacuum chamber 210 to obtain and maintain a state of ultra-high vacuum. Because the one or more pumps and/or elements 222 are able to bring the interior of the carousel vacuum chamber 210 to a state of UHV without breaking the UHV in the UHV chamber 208 or causing a misalignment of the optics of the modular UHV electron microscope 202. In some embodiments, the carousel vacuum bay 210 may further optionally include at least one door and/or port 224 that are able to be selectively opened to allow access to the interior of the carousel vacuum bay 210. Alternatively, or in addition, the carousel vacuum bay 210 may further optionally include a UHV loader 226 configured to receive a UHV compartment from the environment and introduce the UHV compartment to the interior of the carousel vacuum chamber 210 without breaking the vacuum in the carousel vacuum chamber.

Figure 3:
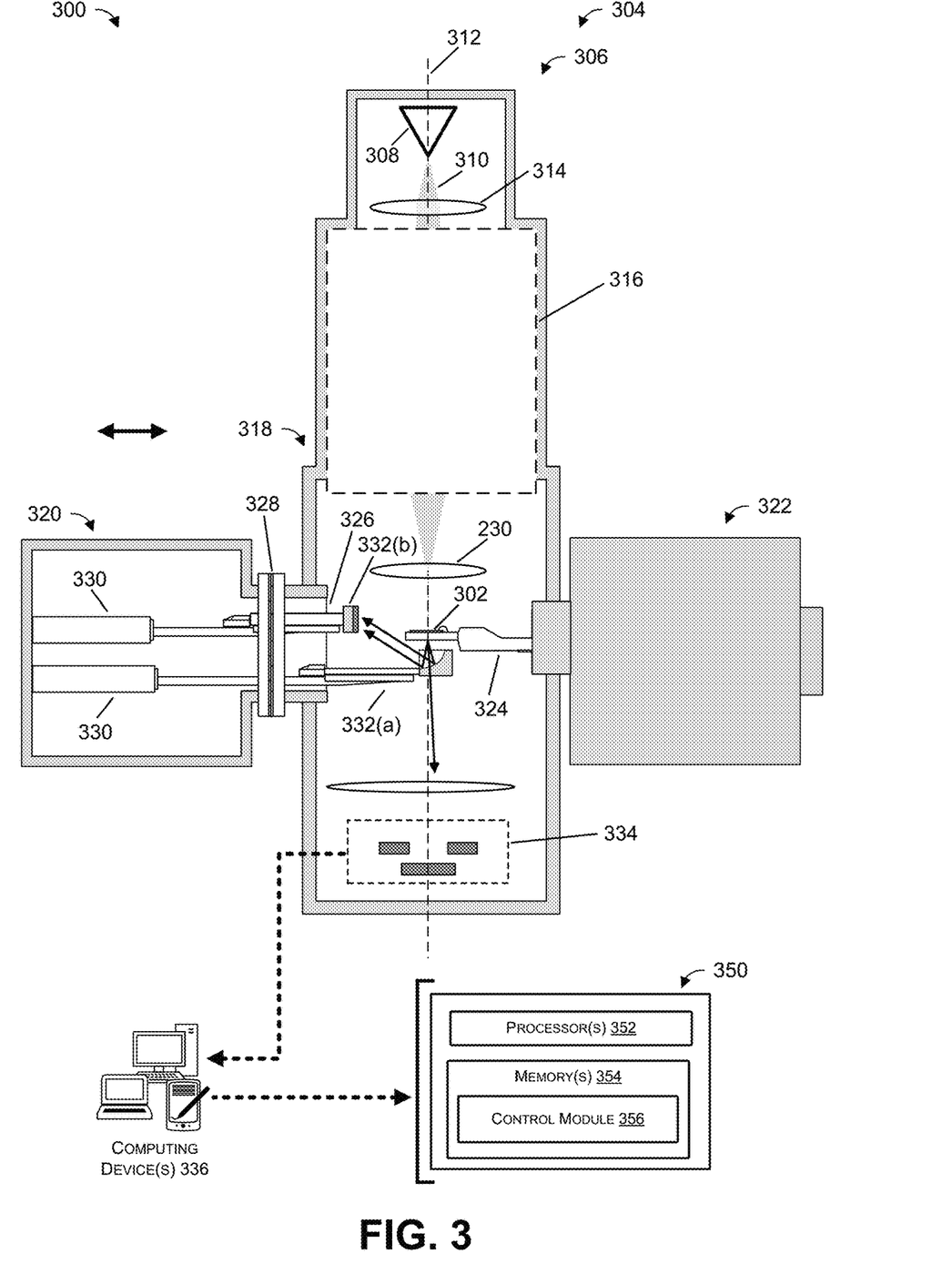
FIG. 3 is an illustration of example environment for investigating a sample with an example modular UHV electron microscope.

FIG. 3 is an illustration of example environment 300 for investigating a sample 302 with an example modular ultra-high vacuum (UHV) electron microscopes 304. Specifically, FIG. 3 shows example environment 300 as including example modular UHV charged particle system(s) 304 for investigation and/or analysis of a sample 302. The example modular UHV charged particle system(s) 304 may be or include one or more different types of optical, and/or charged particle microscopes, such as, but not limited to, a scanning transmission electron microscope (STEM), a transmission electron microscope (TEM), a charged particle microscope (CPM), a cryo-compatible microscope, focused ion beam microscope (FIBs), dual beam microscopy system, or combinations thereof. FIG. 3 shows the example modular UHV charged particle microscope system(s) 304 as being a modular UHV transmission electron microscope (TEM) 306.

The example modular UHV charged particle microscope system(s) 304 includes a charged particle source 308 (e.g., a thermal electron source, Schottky-emission source, field emission source, etc.) that emits an electron beam 310 along an emission axis 312 and towards a transmission electron lens 314.

The emission axis 312 is a central axis that runs along the length of the example charged particle microscope system(s) 304 from the charged particle source 308 and through the sample 302. In some embodiments, an accelerator lens may be positioned between the charged particle source 308 and the transmission lens 314. Such an accelerator lens accelerates/decelerates, focuses, and/or directs the electron beam 310 towards the transmission lens 314 (when positioned above it) or towards a focusing column 316 (when positioned below the transmission lens 314).

The focusing column 316 focuses the electron beam 310 so that it is incident on at least a portion of the sample 302. In some embodiments, the focusing column 316 may include one or more of an aperture, scan coils, and upper condenser lens. The focusing column focuses electrons from the electron source into a small spot on the sample. Different locations of the sample 302 may be scanned by adjusting the electron beam direction via the scan coils. Additionally, the focusing column 316 may correct and/or tune aberrations (e.g., geometric aberrations, chromatic aberrations) of the electron beam 310.

FIG. 3. shows the example modular UHV microscope 304 as including a UHV chamber 318, a carousel vacuum chamber 320, and a sample bay 322. According to the present invention, the UHV chamber 318 and the carousel vacuum chamber 320 are each configured to independently obtain and maintain an ultra-high vacuum. While not depicted in FIG. 3, a person having skill in the art would understand that the UHV chamber 318 and carousel vacuum chamber 320 would each include one or more pumps and/or elements configured to allow the UHV chamber 318 and carousel vacuum chamber 320 to each obtain and maintain a state of ultra-high vacuum. The sample bay 322 is configured to allow a user to introduce and/or otherwise prepare sample 302 for investigation within the example modular UHV microscope 304. For example, a user may prepare sample 302 for investigation by attaching it to a sample holder 324 within the sample bay 322, where the sample holder 324 is configured to extend and translate the sample into a position within the UHV chamber 318 where it can be irradiated by the electron beam 310. The sample holder 324 is configured to hold the sample 302, and can translate, rotate, and/or tilt the sample 302 in relation to the example charged particle microscope system(s) 204. While the sample 302 is depicted as material deposited on a sample support structure (e.g., mesh, foil, grids, etc.) configured to contain the sample, in other example embodiments the sample holder could be a structure capable of having a lamella (or other sample 302) attached thereto.

The carousel vacuum bay 320 is illustrated as being connected to the UHV chamber 318 via a port 326, and which is configured to reach and maintain an ultra-high vacuum independently of the UHV chamber 318. The port 326 may have a valve 328 configured to selectively switch between operating in an open state and operating in a closed state open. When the valve 328 is operating in the open state, the carousel vacuum bay 320 is open to the UHV chamber 318, and the valve 328 seals the carousel vacuum bay 320 from the UHV chamber 318 when the valve 326 is operating in the closed state.

The carousel vacuum bay 320 is shown FIG. 3 as containing two device manipulators 330. In some embodiments, the carousel vacuum bay 320 may have components that are not described or depicted in association with FIG. 3, such as, for example, components described in association with the carousel vacuum bay 108 of FIG. 1 and/or carousel vacuum bay 210 of FIG. 2. Each of the device manipulators 330 comprise an attachment site for a microscope device 332. When a microscope device 332 is attached to its corresponding attachment site, the corresponding device manipulator 330 may selectively translate the attached microscope device 332 between the carousel vacuum bay 320 and the UHV chamber 318 via the port 326. FIG. 3 shows an embodiment where twos the device manipulator 330 are simultaneously translating microscope devices 332 into the UHV camber 318. The desired position to which a microscope device 332 is translated may be determined based on a type of microscope device 332 attached to the corresponding device manipulator, a user selection, a sample type, microscope settings, an experiment type, or a combination thereof.

FIG. 3 shows the carousel vacuum chamber 320 of UHV electron microscopes 304 as containing only two device manipulators 330, but in other embodiments of UHV electron microscopes 304 the carousel vacuum chamber 320 may contain more device manipulators 330 than can be simultaneously translated through the port 326 into the UHV chamber 318. In such an embodiment, the device manipulators 330 may be configured to translate within the carousel vacuum chamber 330 to allow different combinations of device manipulators 330 to translate their corresponding microscope devices 332 into the UH vacuum chamber 318.

According to the present disclosure, the microscope devices 332 can be selectively attached and detached from attachment sites of the device manipulators 330 without damage to the microscope device, the device manipulator, and/or the attachment site. While not shown in FIG. 3, in some embodiments the carousel vacuum bay 320 may include a plurality of additional microscope devices attached to one or more storage attachment sites. In such embodiments, the individual microscope devices 332 be selectively attached and detached to individual storage attachment sites within the carousel vacuum bay 320.

During TEM imaging, the electron beam 310 is directed such that it irradiates and/or passed through a region of interest on the sample 302. A portion of the electrons passing through sample 302 and/or emissions caused by the electron beam 310 impinge on a microscope detector system 334. In this way, electrons and/or emissions generated during irradiation of the sample 302 are captured by the detector system 334, which then generates detector data that can be used to create a reconstruction of the region of interest of the sample 302. FIG. 3 further shows an embodiment where device manipulators 330 have translated a mirror device 332(*a*) and a detector device 332(*b*), where the mirror device 332(*a*) is configured to reflect a portion of the electrons passing through sample 302 and/or emissions caused by the electron beam 310 onto the detector device 332(*b*).

A person having skill in the art would understand that the example modular UHV charged particle system(s) 304 is not limited to embodiments with these two microscope devices 332. For example, after a sufficient amount of detector data of a first type is captured by the detector device 332(*b*), the detector device 332(*b*) may be translated back to the carousel vacuum chamber 320 by the device manipulator 330 and through the port 326, and a different detector device may be translated by a device manipulator 330 (e.g., the same device manipulator or a different device manipulator) into the UHV chamber 318 so that a second type of detector data can be captured with the different detector device. In this way, the example modular UHV charged particle system(s) 304 can use a far wider variety of microscope devices than current UHV charged particle systems are able to provide. This greatly improves the number and types of investigations/experiments that the example modular UHV charged particle system(s) 304 can perform. For example, a device manipulator 330 may translate a gas deposition device 332 into the UHV chamber 318 so that a substance can be deposited and/or grown on the sample 312, and then the device manipulator 330 (or a different device manipulator) can translate an additional microscope device 332 into the UHV chamber 318 so that a user can further deposit, manipulate, stimulate, or capture detector data relating to the deposited substance and/or sample without breaking the ultra-high vacuum in the UHV chamber 318.

In FIG. 3, the microscope detector system 334 is illustrated as including a disk-shaped bright field detector and dark field detector(s). In some embodiments, the microscope detector system 334 may include one or more other detectors. Alternatively, or in addition, the microscope detector system 334 may include a scanning electron microscope detector system, a focused ion beam detector system, a scanning electron microscope secondary electron detector system, a focused ion beam secondary electron detector system, and an optical microscope detector system.

FIG. 3 further illustrates the example modular UI-TV charged particle system(s) 304 as further including a computing device(s) 336. FIG. 3 further includes a schematic diagram illustrating an example computing architecture 350 of the computing devices 336. Example computing architecture 350 illustrates additional details of hardware and software components that can be used to implement the techniques described in the present disclosure. Persons having skill in the art would understand that the computing architecture 350 may be implemented in a single computing device 336 or may be implemented across multiple computing devices. For example, individual modules and/or data constructs depicted in computing architecture 350 may be executed by and/or stored on different computing devices 336. In this way, different process steps of the inventive method according to the present disclosure may be executed and/or performed by separate computing devices 336.

In the example computing architecture 350, the computing device includes one or more processors 352 and memory 354 communicatively coupled to the one or more processors 352. The example computing architecture 350 can include a control module 356 stored in the memory 354. As used herein, the term "module" is intended to represent example divisions of executable instructions for purposes of discussion and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 350 can be executed across multiple computing devices 336.

The control module 356 can be executable by the processors 352 to cause a computing device 336 and/or example modular UHV charged particle system(s) 304 to take one or more actions. For example, the control module 356 may cause the example modular UHV charged particle system(s) 304 to cause the sample holder 324 to apply a translation, tilt, rotation, or a combination thereof. Additionally, the control module 356 may cause the charged particle emitter 308 to emit the electron beam 310.

In some embodiments, the control module 356 may be further configured to cause a computing device 336 to adjust one or more optical characteristics of optical elements (e.g., position, orientation, mode of operation, applied voltages, etc.) in the example modular UHV charged particle system(s) 304 or components thereof. For example, the control module 356 may adjust the optical characteristics of or other components of the example modular UHV charged particle system(s) 304 (e.g., components of the focusing column 316, an objective lens, transfer lens(es), deflectors, an accelerator lens, etc., or a combination thereof) so that the combined spherical aberration, coma, astigmatism, and/or field curvature in the electron beam 310 at the sample 302 is corrected. The control module 356 is further configured to cause the one or more pumps and/or elements configured to allow the UHV chamber 318, the carousel vacuum chamber 320, or both, to obtain or maintain a state of ultra-high vacuum. For example, the control module 356 may cause one or more associated elements to bake the UHV chamber 320 to reduce the gasses released by its body, and then cause one or more pumps to remove gas from the interior volume of the carousel vacuum chamber 320 until a state of ultra-high vacuum is achieved.

Additionally, the control module 356 may be configured to cause individual device manipulators 330 to translate particular microscope devices 332 attached thereto into a desired position within the UHV chamber 318. For example, the control module 356 may control the one or more device manipulators 330 so that more than one microscope device 332 is positioned in the UHV chamber 318 via the port 326. In this way, particular microscope devices 332 are is positioned at a desired location in the UHV chamber 318. In various embodiments, the control module 356 may select the particular microscope device 332 and/or its desired position within the UHV chamber 318 based on a user selection(s), an associated experiment, a selected task/function, predetermined schedule, or a combination thereof.

In some situations, this will comprise an extension/translation/movement of the device manipulator 330 (or component elements thereof) such that the particular microscope device 332 is positioned at a desired location in the UHV chamber 318. In situations where there is more than one device manipulator 330, the control module 356 may cause the device manipulators 330 to be moved within the carousel vacuum chamber 320 so that an associated device manipulator 330 is positioned to translate the particular microscope device 332 into the UHV chamber 318 via the port 326. In such situations, these movements may include individually translating device manipulators 332 within the carousel vacuum chamber 320, translating more than one device manipulator 332 by moving, rotating, or actuating a structure that they are attached to, or a combination thereof.

In some embodiments, the control module 354 may be executable to add or remove microscope devices 32 from the carousel vacuum bay 320. This may include causing the valve 328 to switch to a closed mode of operation, and one or more doors or ports being opened such that microscope devices 332 can be added or removed to the carousel vacuum chamber 320. If the state of ultra-high vacuum in the carousel vacuum bay 320 is broken in this way, the control module 356 may be configured to cause one or more pumps and/or elements configured to allow the carousel vacuum bay 320 to re-obtain a state of ultra-high vacuum.

The control module 354 may be further configured to cause one or more loading mechanisms to transition individual microscope devices 332 between attachment to a corresponding attachment site and attachment to a corresponding storage attachment. In this way, an undesired microscope device 332 can be detached from a device manipulator 330 and affixed to a storage attachment site within the carousel vacuum bay 320, and/or a microscope device 332 can be detached from a storage attachment site within the carousel vacuum bay 320 and attached to t device manipulator 330.

The control module 354 may further be executable to cause the microscope devices 332 to perform their associated functionalities. For example, where the microscope device 332 is a gas deposition unit, the control module 356 may provide electrical instructions to control the type of gas that is deposited, the rate of deposition, the time of deposition, and/or the amount of gas deposited. Alternatively, where the microscope devices 332 is a detector, the control module 354 may provide electrical instructions so that the detector creates detector data and transmit it to the memory 354 and/or an associated computing device 336.

When it is no longer desired to have the microscope devices 332 in the UHV chamber 318 the control module 356 can cause one or more of the device manipulators 330 to retract associated microscope devices 332 into the carousel vacuum chamber 320 via the port 326. The control module 356 can then prepare to translate a next set of microscope devices 332 into the UHV chamber 318 as is determined by user selection(s), an experiment protocol, a predetermine set of instructions, or a combination thereof.

As discussed above, the computing devices 336 include one or more processors 352 configured to execute instructions, applications, or programs stored in a memory(s) 354 accessible to the one or more processors. In some examples, the one or more processors 352 may include hardware processors that include, without limitation, a hardware central processing unit (CPU), a graphics processing unit (GPU), and so on. While in many instances the techniques are described herein as being performed by the one or more processors 352, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 354 accessible to the one or more processors 352 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 354 and other storage devices for purposes of memory management and data integrity. Alternatively, in other implementations, some or all the software components may execute in memory on another device and communicate with the computing devices 336. Some or all of the system components or data structures may also be stored (e.g., as instructions or structured data) on anon-transitory, computer accessible medium or a portable article to be read by an appropriate drive, various examples of which are described above. In some implementations, instructions stored on a computer-accessible medium separate from the computing devices 336 may be transmitted to the computing devices 336 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Figure 4:
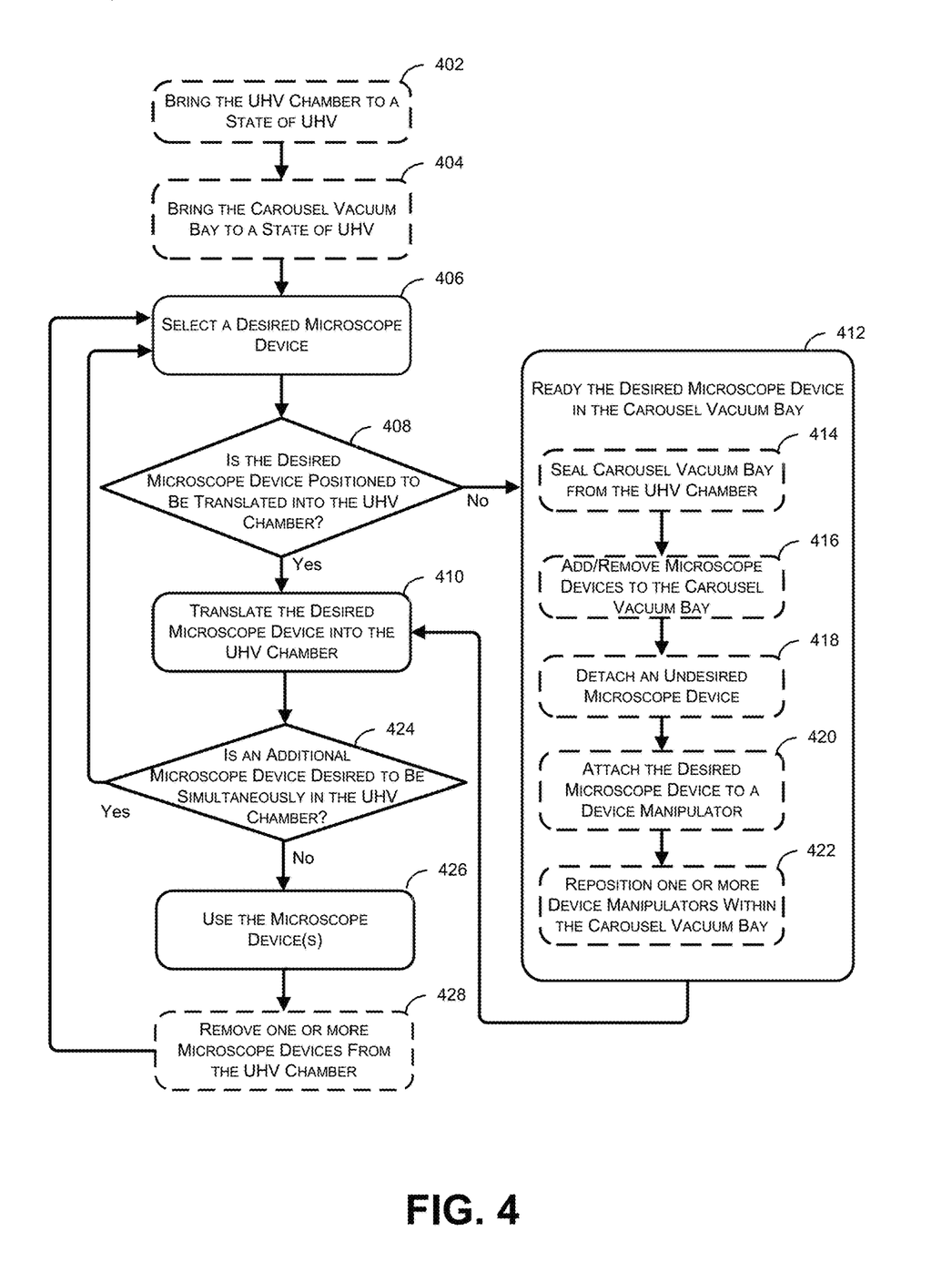
FIG. 4 is a flow diagram of an illustrative process for conducting experiments/sample investigations with a modular UHV electron microscope.

FIG. 4 is a flow diagram of illustrative processes depicted as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 4 is a flow diagram of an illustrative process 400 for conducting experiments/sample investigations with a modular ultra-high vacuum (UHV) electron microscope. The process 400 may be implemented in environments 100, 200, 300 and/or by one or more computing device(s) 336, and/or by the computing architecture 350, and/or in other environments and computing devices.

At 402, the UHV chamber of the modular UHV electron microscope is optionally brought to a state of ultra-high vacuum. This process may include baking the UHV chamber such that the component materials of the UHV chamber release gas at a reduced rate, and then pumping gas out of the UHV chamber until a state of ultra-high vacuum is achieved. The baking of the UHV chamber can cause misalignment of the optical column of the modular UHV electron microscope, requiring the optical column to be realigned.

At 404, the carousel vacuum bay of the modular UHV electron microscope is optionally brought to a state of ultra-high vacuum. This may occur simultaneously with the UHV chamber or may be performed separately. For example, if the valve of the port connecting the UHV chamber and the carousel vacuum bay is in a closed state, the vacuum within the carousel vacuum bay can be broken and then re-established (via baking and pumping) without breaking the vacuum in the UHV chamber, or misaligning the optical column of the modular UHV electron microscope.

At 406, a desired microscope device is selected. In various embodiments, the desired microscope device and/or its desired position within the UHV chamber may be selected based on a user selection(s), an associated experiment, a selected task/function, predetermined schedule, or a combination thereof. For example, a user may have indicated a series of experiments, investigations, or other actions that are to occur in the UHV chamber. The modular UHV electron microscope may be configured to automatically follow the schedule such that particular microscope devices are used in the scheduled order.

At 408, it is determined whether the desired microscope devices are positioned to be translated into the UHV chamber. That is, it is determined whether the desired microscope device is attached to a device manipulator that is positioned within the carousel vacuum bay such that the device manipulator can extend, translate, and/or move a component portion of the device manipulator such that the desired microscope device moved through the port and into a desired location in the UHV chamber. If the answer at 408 is yes, the process continues to step 410, and the desired microscope device is translated into the UHV chamber.

Alternatively, if the answer at 408 is no, the process continues to step 412, and the desired microscope device is readied within the carousel vacuum bay. Within the scope of the present invention, readying the desired microscope device within the carousel vacuum bay may optionally include one or more of sealing the carousel vacuum bay from the UHV chamber via a valve at 414, adding or removing microscope devices to the carousel vacuum bay at 416, detaching an undesired microscope device from a device manipulator at 418, attaching a desired microscope device to a device manipulator at 420, and/or repositioning one or more device manipulators within the carousel vacuum bay at 422. Additional details of these steps are discussed in association with FIGS. 1-3. The process continues at 410, where the desired microscope device is translated into the UHV chamber.

At 424, it is determined whether an additional microscope device is desired to simultaneously be in the UHV chamber. For example, in some experimental setups it may be desired to have multiple microscope devices housed in the carousel vacuum bay to be positioned in the UHV chamber at the same time. If the answer at 408 is yes, the process returns to step 406, and the additional microscope device is selected.

Alternatively, if the answer at 424 is no, the process continues to step 426, and the desired microscope device is used. For example, where the microscope devices are a gas deposition unit, it may be used to introduce a gas to an area on or near the sample. The modular UHV electron microscope may provide electrical instructions to control the type of gas that is deposited, the rate of deposition, the time of deposition, and/or the amount of gas deposited. Alternatively, where the microscope device is a detector, the attachment site to which the detector is affixed to a corresponding device manipulator may provide an electrical and/or data connection that allows the detector to passively create detector data and transmit it to a memory and/or an associated computing device. For example, the detector may detect emissions resultant from irradiation with the electron beam of the modular UHV electron microscope, or otherwise stimulated by another microscope devices.

At 428, one or more of the microscope devices is optionally removed from the UHV chamber, and the process may continue at step 406, where another desired microscope device is selected. In this way, the variety of microscope devices can be used within the modular ultra-high vacuum (UHV) electron microscope without needing to break the state of ultra-high vacuum in the UHV chamber.

Examples of inventive subject matter according to the present disclosure are described in the following enumerated paragraphs.

A1. An ultra-high (UH) vacuum electron microscope system for investigation of a sample, comprising: an UH vacuum chamber configured to reach and maintain a UH vacuum within the chamber; an ultra-high vacuum stage configured to hold the sample; a charged particle source configured to emit a plurality of electrons toward the sample; an optical column configured to direct the plurality of electrons to be incident on the sample; a carousel vacuum bay configured to reach and maintain a UH vacuum within the carousel vacuum bay independently of the UH vacuum chamber, wherein: the carousel vacuum bay is connected to the UH vacuum chamber via a port; the carousel vacuum bay contains at least one device manipulator, each of the device manipulators comprising an attachment site for a microscope device; and each of the device manipulators is further configured to, when a microscope device is attached to its corresponding attachment site, selectively translate the attached microscope device between the carousel vacuum bay and the UH vacuum chamber via the valve.

A1.1. The UH vacuum electron microscope system of paragraph A1, wherein the port has a valve configured to selectively switch between operating in an open state and operating in a closed state open.

A1.1.1. The UH vacuum electron microscope system of paragraph A1.1, wherein the carousel vacuum bay is open to the UH vacuum chamber when the valve is operating in the open state, and the valve seals the carousel vacuum bay from the UH vacuum chamber when the valve is operating in the closed state.

A1.1.2. The UH vacuum electron microscope system of any of paragraphs A1.1-A1.1.1, wherein when the valve is operating in the closed state, the vacuum in the carousel vacuum chamber can be broken without breaking the UH vacuum in the UH vacuum chamber.

A1.1.3. The UH vacuum electron microscope system of any of paragraphs A1.1-A1.1.2, wherein when the valve is operating in the open state the carousel vacuum bay and the UH vacuum chamber form a continuous volume.

A1.2. The UH vacuum electron microscope system of any of paragraphs A1-A1.1.3, wherein the carousel vacuum bay configured to obtain UH vacuum within the vacuum carousel bay independently of the UH vacuum chamber.

A1.2.1. The UH vacuum electron microscope system of paragraph A1.2, wherein when the valve is operating in the closed state, the UH vacuum chamber can be used to investigate the sample while a UH vacuum is being obtained in the vacuum carousel bay.

A1.2.2. The UH vacuum electron microscope system of any of paragraphs A1.2-A1.2.1, wherein when the valve is operating in the closed state, the UH vacuum chamber can be used to investigate the sample while the vacuum carousel bay is not at a vacuum or UH vacuum state.

A2. The UH vacuum electron microscope system of any of paragraphs A1-A1.2.2, wherein selectively translating comprises translating the microscope device to a desired position in relation to the sample.

A2.1. The UH vacuum electron microscope system of paragraph A2, wherein the translation to desired position is based on a type of microscope device attached to the corresponding device manipulator.

A2.2. The UH vacuum electron microscope system of any of paragraphs A2-A2.1, wherein the translation to desired position is based on a user selection.

A2.3. The UH vacuum electron microscope system of any of paragraphs A2-A2.2, wherein the translation to desired position is based on an experiment type.

A3. The UH vacuum electron microscope system of any of paragraphs A1-A2.3, wherein an attachment site comprises at least one of a mechanical connector, a data connection, an electrical connection, and a gas connection.

A4. The UH vacuum electron microscope system of any of paragraphs A1-A3, wherein the carousel vacuum bay contains a plurality of device manipulators.

A4.1. The UH vacuum electron microscope system of paragraph A4, wherein a plurality of device manipulators can translate corresponding microscope devices into UH vacuum chamber via the valve at the same time.

A4.1.1. The UH vacuum electron microscope system of paragraph A4, wherein two device manipulators can translate corresponding microscope devices into the UH vacuum chamber via the valve at the same time.

A4.1.2. The UH vacuum electron microscope system of paragraph A4.1, wherein at least three device manipulators can translate corresponding microscope devices into UH vacuum chamber via the valve at the same time.

A4.2. The UH vacuum electron microscope system of any of paragraphs A4-A4.1.2, wherein individual device manipulators can be translated within the carousel vacuum chamber to allow different combinations of device manipulators to translate corresponding microscope devices into the UH vacuum chamber via the valve.

A5. The UH vacuum electron microscope system of any of paragraphs A1-A4.2, wherein the microscope devices can be selectively attached and detached from attachment sites of the device manipulators.

A5.1. The UH vacuum electron microscope system of paragraph A5, wherein the microscope devices can be selectively attached and detached without damage to the microscope device, the device manipulator, and/or the attachment site.

A5.2. The UH vacuum electron microscope system of any of paragraphs A5-A5.1, wherein the carousel vacuum bay comprises a plurality of additional microscope devices.

A5.2.1. The UH vacuum electron microscope system of paragraph A5.2, wherein the carousel vacuum bay comprises one or more storage attachment sites, wherein individual microscope devices can be selectively attached and detached to individual storage attachment sites.

A5.2.1.1. The UH vacuum electron microscope system of paragraph A5.2.1, wherein the individual microscope devices can be selectively attached and detached without damage to the microscope device, and/or the attachment site.

A5.2.1.2. The UH vacuum electron microscope system of any of paragraphs A5.2.1-A5.2.1.1, wherein individual microscope devices can be attached to the storage attachment sites when the corresponding microscope device is not in use.

A6. The UH vacuum electron microscope system of any of paragraphs A1-A5.2.1.2, wherein the carousel vacuum bay further comprises a loading mechanism configured to transition individual microscope devices between attachment to a corresponding attachment site and attachment to a corresponding storage attachment site.

A6.1. The UH vacuum electron microscope system of paragraph A6, wherein the loading mechanism can detach a microscope device from a corresponding attachment site without breaking an UH vacuum in the carousel vacuum bay.

A6.2. The UH vacuum electron microscope system of any of paragraphs A6-A6.1, wherein the loading mechanism can attach a microscope device to a corresponding attachment site without breaking an UH vacuum in the carousel vacuum bay.

A6.3. The UH vacuum electron microscope system of any of paragraphs A6-A6.2, wherein the loading mechanism can detach a microscope device from a corresponding storage site without breaking an UH vacuum in the carousel vacuum bay.

A6.4. The UH vacuum electron microscope system of any of paragraphs A6-A6.3, wherein the loading mechanism can attach a microscope device to a corresponding storage site without breaking an UH vacuum in the carousel vacuum bay.

A7. The UH vacuum electron microscope system of any of paragraphs A1-A6.4, wherein the vacuum chamber is configured to be baked to reduce gas load from the bulk material, and then reduce the pressure via pumping.

A7.1. The UH vacuum electron microscope system of paragraph A7, wherein the carousel vacuum bay can be independently baked to reduce gas load from the bulk material and then reduced to UH vacuum via pumping.

A7.2. The UH vacuum electron microscope system of paragraph A7.1, wherein the carousel vacuum bay can be baked and reduced to UH vacuum without breaking the UH vacuum in the UH vacuum chamber.

A8. The UH vacuum electron microscope system of any of paragraphs A1-A7.2, wherein the carousel vacuum bay comprises at least one door and/or port configured to maintain the UH vacuum in the carousel vacuum bay when in a closed state and allow entrance into the carousel vacuum bay from the environment when in an open state.

A8.1. The UH vacuum electron microscope system of paragraph A8, wherein, when the at least one door and/or port is in a closed state, the at least one door and/or port maintains the vacuum in the carousel vacuum bay and/or the UH vacuum chamber.

A8.2. The UH vacuum electron microscope system of any of paragraphs A8-A8.1, wherein, when the at least one door and/or port is in an open state one or more additional microscope devices can be added to the carousel vacuum bay.

A8.3. The UH vacuum electron microscope system of any of paragraphs A8-A8.2, wherein when the at least one door and/or port is in an open state one or more additional microscope devices can be removed from the carousel vacuum bay.

A8.4. The UH vacuum electron microscope system of any of paragraphs A8-A8.3, wherein, when the at least one door and/or port is in an open state one or more additional device manipulators can be added to the carousel vacuum bay.

A8.5. The UH vacuum electron microscope system of any of paragraphs A8-A8.4, wherein, when the at least one door and/or port is in an open state one or more additional device manipulators can be removed from the carousel vacuum bay.

A9. The UH vacuum electron microscope system of any of paragraphs A8-A8.4, wherein, when the valve is in an open state, the valve defines an aperture having a diameter of at least one of 30 mm, 60 mm, 90 mm, 120 mm.

A10. The UH vacuum electron microscope system of any of paragraphs A1-A9, wherein the microscope devices include detectors, stimuli, mirrors, etc.

A11. The UH vacuum electron microscope system of any of paragraphs A1-A10, wherein the carousel chamber includes a UHV loader configured to receive a UHV compartment from the environment and introduce the UH compartment to the interior of the carousel vacuum chamber without breaking the vacuum in the carousel vacuum chamber.

A11.1. The UH vacuum electron microscope system of paragraph A11, wherein the UHV compartment defines an inner volume, wherein the inner volume is at UHV.

A11.1.1. The UH vacuum electron microscope system of paragraph A11.1, wherein the inner volume comprises a new microscope device.

A11.1.2. The UH vacuum electron microscope system of any of paragraphs A11.1-A11.1.1, wherein the loader is further configured to remove the new microscope device from the UHV compartment A11.1.2.1. The UH vacuum electron microscope system of paragraph A11.1.2, wherein the loader is further configured to attach the new microscope device to a corresponding attachment site or storage site.

B1. A method for operating an ultra-high vacuum (UHV) charged particle microscope, the method comprising: translating a first microscope device from a UHV chamber to a carousel vacuum chamber via a port; and translating a second microscope device from the carousel vacuum chamber to the UHV chamber via the port, wherein the UHV is maintained in the UHV chamber while the first microscope device is translated and second microscope device is translated.

B1.1. The method of paragraph B1, wherein the first microscope device is different from the second microscope device.

B1.2. The method of any of paragraphs B1-B1.1, wherein translating the first microscope device comprises retracting a device manipulator into the carousel vacuum chamber, wherein the first microscope device is attached to an attachment site on the device manipulator.

B1.2.1. The method of paragraph B1.2, wherein translating the second microscope device comprises extending the device manipulator into the carousel vacuum chamber, wherein the second microscope device is attached to the attachment site on the device manipulator.

B1.2.2. The method of any of paragraphs B1.2-B1.2.1, wherein the method further comprises removing the first microscope device from the device manipulator.

B1.2.2.1. The method of paragraph B1.2.2, wherein removing the first microscope device from the device manipulator comprises detaching the first microscope site from the attachment site.

B1.2.3. The method of any of paragraphs B1.2-B1.2.2.1, wherein the method further comprises attaching the second microscope device to the device manipulator.

B1.2.3.1. The method of paragraph B1.2.3, wherein attaching the second microscope device to the device manipulator comprises attaching the second microscope site to the attachment site.

B1.2.4. The method of any of paragraphs B1.2-B1.2.3.1, wherein the first microscope device is detached from the attachment site with a device loader without breaking the UHV in the UHV chamber.

B1.2.4.1. The method of any of paragraphs B1.2-B1.2.4, wherein the first microscope device is attached to a storage site within the carousel vacuum chamber with the device loader without breaking the UHV in the UHV chamber.

B1.2.5. The method of any of paragraphs B1.2-B1.2.4.1, wherein the second microscope device is attached to the attachment site with the device loader without breaking the UHV in the UHV chamber.

B1.2.5.1. The method of any of paragraphs B1.2-B1.2.5, wherein the second microscope device is attached to the attachment site with the device loader without breaking the UHV in the carousel vacuum chamber.

B2. The method of any of paragraphs B1-B1.2, wherein the device manipulator is a first device manipulator, and translating the second microscope device comprises extending a second device manipulator from the carousel vacuum chamber and into the UHV chamber via the port.

B2.1. The method of paragraph B2, wherein the second microscope device is attached to an attachment site on the second device manipulator.

B2.2. The method of any of paragraphs B2-B2.1, wherein the method further comprises translating at least one of the first device manipulator and the second device manipulator within the carousel vacuum chamber so that the second device manipulator can extend into the UHV chamber.

B2.3. The method of any of paragraphs B2-B2.2, wherein the first microscope device is translated after the second microscope device is translated such that, prior to the translation of the first microscope device, both the first microscope device and the second device are in the UHV chamber at the same time.

B3. The method of any of paragraphs B1-B2.3, further comprising translating a third microscope device from the carousel vacuum chamber to the UHV chamber via the port.

B3.1. The method of paragraph B3, wherein the third microscope device is different from the first and second microscope device, and wherein the UHV is maintained in the UHV chamber while the third microscope device is translated.

B3.2. The method of any of paragraphs B3-B3.1, wherein when the second microscope device remains in the UHV chamber while the third microscope device is translated to the UHV chamber via the port.

B3.3. The method of any of paragraphs B3-B3.2, wherein the third microscope device is translated into the UHV chamber by extending a same device manipulator as is used to translate the first microscope device from the UHV chamber to the carousel vacuum chamber.

B3.4. The method of any of paragraphs B3-B3.2, wherein the third microscope device, the second microscope device, and the first microscope device are each translated between the UHV chamber and the carousel vacuum chamber by different device manipulators.

B4. The method of any of paragraphs B1-B3.4., wherein the port comprises a valve configured to selectable operate in an open state and a closed state open where the carousel vacuum bay is open to the UHV chamber and closed where the valve seals the carousel vacuum bay is from the UHV chamber.

B5. The method of any of paragraphs B1-B4, wherein the first microscope device is translated before the second microscope device is translated, and before the second microscope device is translated: the valve is switched to the closed state so that the carousel vacuum bay is sealed from the UHV chamber; the vacuum in the carousel vacuum bay is broken without breaking the UHV in the UHV chamber; a volume within the carousel vacuum bay is brought to UHV; and the valve is switched to the open state so that the second microscope device can be translated between the carousel vacuum chamber and the UHV chamber.

B5.1. The method of paragraph B5, further including the step of opening the carousel vacuum chamber to the environment while the valve is switched to the closed state.

B5.2. The method of any of paragraphs B5-B5.1, wherein adding a new microscope device to the carousel vacuum chamber while the valve is switched to the closed state.

B5.3. The method of any of paragraphs B5-B5.2, wherein Removing a microscope device from the carousel vacuum chamber while the valve is switched to the closed state.

B6. The method of any of paragraphs B1-B5.3, wherein the microscope devices include detectors, stimuli, mirrors, etc.

C1. A method for operating an ultra-high vacuum (UHV) charged particle microscope, the method comprising: translating a first microscope device between a UHV chamber and a carousel vacuum chamber via a port; and translating a second microscope device between the carousel vacuum chamber and the UHV chamber via the port, wherein the UHV is maintained in the UHV chamber while the first microscope device is translated and second microscope device is translated.

C1.1. The method of paragraph C1, wherein the first microscope device is different from the second microscope device.

C1.2. The method of any of paragraphs C1-C1.1, wherein translating the first microscope device comprises retracting a device manipulator into the carousel vacuum chamber, wherein the first microscope device is attached to an attachment site on the device manipulator.

C1.2.1. The method of paragraph C1.2, wherein translating the second microscope device comprises extending the device manipulator into the carousel vacuum chamber, wherein the second microscope device is attached to the attachment site on the device manipulator.

C1.2.2. The method of any of paragraphs C1.2-C1.2.1, wherein the method further comprises removing the first microscope device from the device manipulator.

C1.2.2.1. The method of paragraph C1.2.2, wherein removing the first microscope device from the device manipulator comprises detaching the first microscope site from the attachment site.

C1.2.3. The method of any of paragraphs C1.2-C1.2.2.1, wherein the method further comprises attaching the second microscope device to the device manipulator.

C1.2.3.1. The method of paragraph C1.2.3, wherein attaching the second microscope device to the device manipulator comprises attaching the second microscope site to the attachment site.

C1.2.4. The method of any of paragraphs C1.2-C1.2.3.1, wherein the first microscope device is detached from the attachment site with a device loader without breaking the UHV in the UHV chamber.

C1.2.4.1. The method of any of paragraphs C1.2-C1.2.4, wherein the first microscope device is attached to a storage site within the carousel vacuum chamber with the device loader without breaking the UHV in the UHV chamber.

C1.2.5. The method of any of paragraphs C1.2-C1.2.4.1, wherein the second microscope device is attached to the attachment site with the device loader without breaking the UHV in the UHV chamber.

C1.2.5.1. The method of any of paragraphs C1.2-C1.2.5, wherein the second microscope device is attached to the attachment site with the device loader without breaking the UHV in the carousel vacuum chamber.

C2. The method of any of paragraphs C1-C1.2, wherein the device manipulator is a first device manipulator, and translating the second microscope device comprises extending a second device manipulator from the carousel vacuum chamber and into the UHV chamber via the port.

C2.1. The method of paragraph C2, wherein the second microscope device is attached to an attachment site on the second device manipulator.

C2.2. The method of any of paragraphs C2-C2.1, wherein the method further comprises translating at least one of the first device manipulator and the second device manipulator within the carousel vacuum chamber so that the second device manipulator can extend into the UHV chamber.

C2.3. The method of any of paragraphs C2-C2.2, wherein the first microscope device is translated after the second microscope device is translated such that, prior to the translation of the first microscope device, both the first microscope device and the second device are in the UHV chamber at the same time.

C3. The method of any of paragraphs C1-C2.3, further comprising translating a third microscope device from the carousel vacuum chamber to the UHV chamber via the port.

C3.1. The method of paragraph C3, wherein the third microscope device is different from the first and second microscope device, and wherein the UHV is maintained in the UHV chamber while the third microscope device is translated.

C3.2. The method of any of paragraphs C3-C3.1, wherein when the second microscope device remains in the UHV chamber while the third microscope device is translated to the UHV chamber via the port.

C3.3. The method of any of paragraphs C3-C3.2, wherein the third microscope device is translated into the UHV chamber by extending a same device manipulator as is used to translate the first microscope device from the UHV chamber to the carousel vacuum chamber.

C3.4. The method of any of paragraphs C3-C3.2, wherein the third microscope device, the second microscope device, and the first microscope device are each translated between the UHV chamber and the carousel vacuum chamber by different device manipulators.

C4. The method of any of paragraphs C1-C3.4., wherein the port comprises a valve configured to selectable operate in an open state and a closed state open where the carousel vacuum bay is open to the UHV chamber and closed where the valve seals the carousel vacuum bay is from the UHV chamber.

C5. The method of any of paragraphs C1-C4., wherein the first microscope device is translated before the second microscope device is translated, and before the second microscope device is translated: the valve is switched to the closed state so that the carousel vacuum bay is sealed from the UHV chamber; the vacuum in the carousel vacuum bay is broken without breaking the UHV in the UHV chamber; a volume within the carousel vacuum bay is brought to UHV; and the valve is switched to the open state so that the second microscope device can be translated between the carousel vacuum chamber and the UHV chamber.

C5.1. The method of paragraph C5, further including the step of opening the carousel vacuum chamber to the environment while the valve is switched to the closed state.

C5.2. The method of any of paragraphs C5-C5.1, wherein adding a new microscope device to the carousel vacuum chamber while the valve is switched to the closed state.

C5.3. The method of any of paragraphs C5-C5.2, wherein Removing a microscope device from the carousel vacuum chamber while the valve is switched to the closed state.

C6. The method of any of paragraphs C1-C5.3, wherein the microscope devices include detectors, stimuli, mirrors, etc.

D1. Use of any of the UH vacuum electron microscope system of any of paragraphs A1-A11.1.2.1 to perform any of the methods of paragraphs B1-B6 and/or C1-C6.

E1. Non-transitory computer readable medium, storing instructions that, when executed on a processor, cause any of the UH vacuum electron microscope system of any of paragraphs A1-A11.1.2.1 to perform any of the methods of paragraphs B1-B6 and/or C1-C6.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. An ultra-high (UH) vacuum electron microscope system for investigation of a sample, comprising:
   an UH vacuum chamber configured to reach and maintain a first UH vacuum within the chamber;
   an ultra-high vacuum stage configured to hold the sample;
   a charged particle source configured to emit a plurality of electrons toward the sample;
   an optical column configured to direct the plurality of electrons to be incident on the sample;
   a carousel vacuum bay configured to reach and maintain a second UH vacuum within the carousel vacuum bay independently of the UH vacuum chamber, wherein:

the carousel vacuum bay is connected to the UH vacuum chamber via a valve;

the carousel vacuum bay contains at least one device manipulator, the at least one device manipulator comprising an attachment site for a microscope device and ending at an inner wall of the carousel vacuum bay; and the at least one device manipulator is further configured to, when a microscope device is attached to its corresponding attachment site, selectively translate the attached microscope device between the carousel vacuum bay and the UH vacuum chamber via the valve.

2. The UH vacuum electron microscope system of claim 1, wherein the valve is configured to selectively switch between operating in an open state and operating in a closed state, and wherein:

the carousel vacuum bay is open to the UH vacuum chamber when the valve is operating in the open state, and the valve seals the carousel vacuum bay from the UH vacuum chamber when the valve is operating in the closed state.

3. The UH vacuum electron microscope system of claim 1, wherein the carousel vacuum bay configured to obtain the second UH vacuum within the carousel vacuum bay independently of the UH vacuum chamber.

4. The UHV vacuum electron microscope system of claim 3, wherein when the valve is operating in a closed state, the UHV vacuum chamber can be used to investigate the sample while the carousel vacuum bay is not at a vacuum or an UH vacuum state.

5. The UH vacuum electron microscope system of claim 1, wherein selectively translating comprises translating the microscope device to a desired position in relation to the sample based on a type of microscope device attached to a corresponding device manipulator of the at least one device manipulators.

6. The UHV electron microscope system of claim 1, wherein the carousel vacuum bay contains a plurality of device manipulators, the at least one device manipulator being included in the plurality of device manipulators.

7. The UH vacuum electron microscope system of claim 6, wherein the carousel vacuum bay includes a plurality of device manipulators that translate corresponding microscope devices into the UH vacuum chamber via the valve at the same time.

8. The UH vacuum electron microscope system of claim 6, wherein individual device manipulators of the at least one device manipulator can be translated within the carousel vacuum bay to allow different combinations of device manipulators to translate corresponding microscope devices into the UH vacuum chamber via the valve.

9. The UH vacuum electron microscope system of claim 1, wherein the microscope device can be selectively attached and detached from an attachment site of the at least one device manipulator without damage to the microscope device, the device manipulator, or the attachment site.

10. The UH vacuum electron microscope system of claim 9, wherein the carousel vacuum bay comprises a plurality of additional microscope devices that can be selectively attached and detached to individual storage attachment sites without damage to the microscope device, or the attachment site.

11. The UH vacuum electron microscope system of claim 9, wherein the carousel vacuum bay further comprises a loading mechanism configured to transition individual microscope devices between attachment to a corresponding attachment site and attachment to a corresponding storage attachment site.

12. The UH vacuum electron microscope system of claim 1, wherein the UH vacuum chamber is configured to be baked to reduce gas load from a bulk material, and then reduce the pressure via pumping, and the carousel vacuum bay is able to be independently baked to reduce gas load from the bulk material and then reduced to the first UH vacuum via pumping.

13. The UHV vacuum electron microscope system of claim 12, wherein the carousel vacuum bay can be baked and reduced to the second UH vacuum without breaking the first UH vacuum in the UH vacuum chamber.

14. The UH vacuum electron microscope system of claim 12, wherein the carousel vacuum bay comprises at least one door and/or port configured to maintain the second UH vacuum in the carousel vacuum bay when in a closed state and allow entrance into the carousel vacuum bay from the environment when in an open state.

15. The UH vacuum electron microscope system of claim 1, wherein the microscope device include one or more: detectors, stimuli, or mirrors.

16. The UH vacuum electron microscope system of claim 1, wherein the carousel vacuum bay includes a UH vacuum loader configured to receive a UH vacuum compartment from the environment and introduce the UH vacuum compartment to the interior of the carousel vacuum chamber bay without breaking the second UH vacuum in the carousel vacuum bay.

17. The UH vacuum electron microscope system of claim 1, wherein the attachment site includes a gas connection configured to allow a gas injection tool to deliver a gas species at the sample.

18. The UH vacuum electron microscope system of claim 1, wherein the inner wall is opposite the valve, wherein the attachment site of the at least one device manipulator is configured to translate the attached microscope device through the valve into the UH vacuum chamber while an end of the at least one device manipulator remains attached to the inner wall.

19. A method for operating an ultra-high vacuum (UH) charged particle microscope, the method comprising:

translating a first microscope device between an UH vacuum chamber and a carousel vacuum bay via a valve, wherein the first microscope device is connected to a first device manipulator; and translating a second microscope device between the carousel vacuum bay and the UH vacuum chamber via the valve, wherein a first UH vacuum is maintained in the UH vacuum chamber while the first microscope device is translated and the second microscope device is translated, the second microscope device is connected to a second device manipulator, and at least one of the first or second device manipulators ending at an inner wall of the carousel vacuum bay.

20. The method of claim 19, wherein the first microscope device is translated before the second microscope device is translated, and wherein before the second microscope device is translated:

the valve is switched to a closed state so that the carousel vacuum bay is sealed from the UH vacuum chamber and held at a second UH vacuum;

the second UH vacuum in the carousel vacuum bay is broken without breaking the first UH vacuum in the UH vacuum chamber;

a volume within the carousel vacuum bay is brought to the second UH vacuum; and the valve is switched to an open state so that the second microscope device can be translated between the carousel vacuum bay and the UH chamber.

\* \* \* \* \*